(12) United States Patent
Giterman et al.

(10) Patent No.: US 10,991,421 B2
(45) Date of Patent: Apr. 27, 2021

(54) COMPLEMENTARY DUAL-MODULAR REDUNDANCY MEMORY CELL

(71) Applicant: Bar-Ilan University, Ramat-Gan (IL)

(72) Inventors: Robert Giterman, Beer-Sheva (IL); Lior Atias, Ramat-Gan (IL); Adam Teman, Tel-Mond (IL); Alexander Fish, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 26 days.

(21) Appl. No.: 16/317,837

(22) PCT Filed: Sep. 19, 2017

(86) PCT No.: PCT/IL2017/051059
§ 371 (c)(1),
(2) Date: Jan. 15, 2019

(87) PCT Pub. No.: WO2018/051357
PCT Pub. Date: Mar. 22, 2018

(65) Prior Publication Data
US 2019/0295633 A1  Sep. 26, 2019

Related U.S. Application Data

(60) Provisional application No. 62/396,256, filed on Sep. 19, 2016.

(51) Int. Cl.
| | | |
|---|---|---|
| *G11C 11/40* | (2006.01) | |
| *G11C 11/412* | (2006.01) | |
| *G06F 11/10* | (2006.01) | |
| *G11C 11/4093* | (2006.01) | |
| *G11C 11/419* | (2006.01) | |

(Continued)

(52) U.S. Cl.
CPC ...... *G11C 11/4125* (2013.01); *G06F 11/1068* (2013.01); *G11C 5/02* (2013.01); *G11C 11/403* (2013.01); *G11C 11/405* (2013.01); *G11C 11/4093* (2013.01); *G11C 11/4097* (2013.01);
(Continued)

(58) Field of Classification Search
CPC .............. G11C 11/4125; G11C 11/403; G11C 11/4097; G11C 11/405; G11C 5/02; G11C 11/4093; G11C 11/419; G11C 29/52; G11C 2211/4013; G11C 5/005; G06F 11/1068
See application file for complete search history.

(56) References Cited

U.S. PATENT DOCUMENTS

2005/0013163 A1 * 1/2005 Ferrant .................. G11C 11/404
365/185.01

FOREIGN PATENT DOCUMENTS

WO   WO 2018/051357   3/2018

OTHER PUBLICATIONS

International Preliminary Report on Patentability dated Mar. 28, 2019 From the International Bureau of WIPO Re. Application No. PCT/IL2017/051059. (8 Pages).
(Continued)

*Primary Examiner* — Mohammed A Bashar

(57) ABSTRACT

A CDMR memory cell, includes a first bitcell which is used to store a current data level and a second bitcell which is used to store the complementary data level. When a read operation is performed, a comparator compares the data levels read from the two bitcells. If these two levels are not complementary, the comparator outputs an indicator. This indicator serves as an alert that a storage error has, or may have, occurred.

24 Claims, 12 Drawing Sheets

(51) Int. Cl.
G11C 29/52 (2006.01)
G11C 11/403 (2006.01)
G11C 11/4097 (2006.01)
G11C 11/405 (2006.01)
G11C 5/02 (2006.01)

(52) U.S. Cl.
CPC ............ *G11C 11/419* (2013.01); *G11C 29/52* (2013.01); *G11C 2211/4013* (2013.01)

(56) References Cited

OTHER PUBLICATIONS

International Search Report and the Written Opinion dated Dec. 25, 2017 From the International Searching Authority Re. Application No. PCT/IL2017/051059. (10 Pages).

Giterman et al. "A Soft Error Tolerant 4T Gain-Cell Featuring A Parity Colums for Ultra-Low Power Applications", 2015 IEEE SOI-3D-Subthreshold Microelectronics Technology Unified Conference, S3S, Rohnert Park, CA, USA, Oct. 5-8, 2015, 2 P., Oct. 5, 2015. Figs.1, 2.

Giterman et al. "Area and Energy-Efficient Complementary Dual-Modular Redundancy Dynamic Memory for Space Applications", IEEE Transactions on Very Large Scale Integration (VLSI) Systems, 25(2): 502-509, Published Online Sep. 8, 2016.

\* cited by examiner

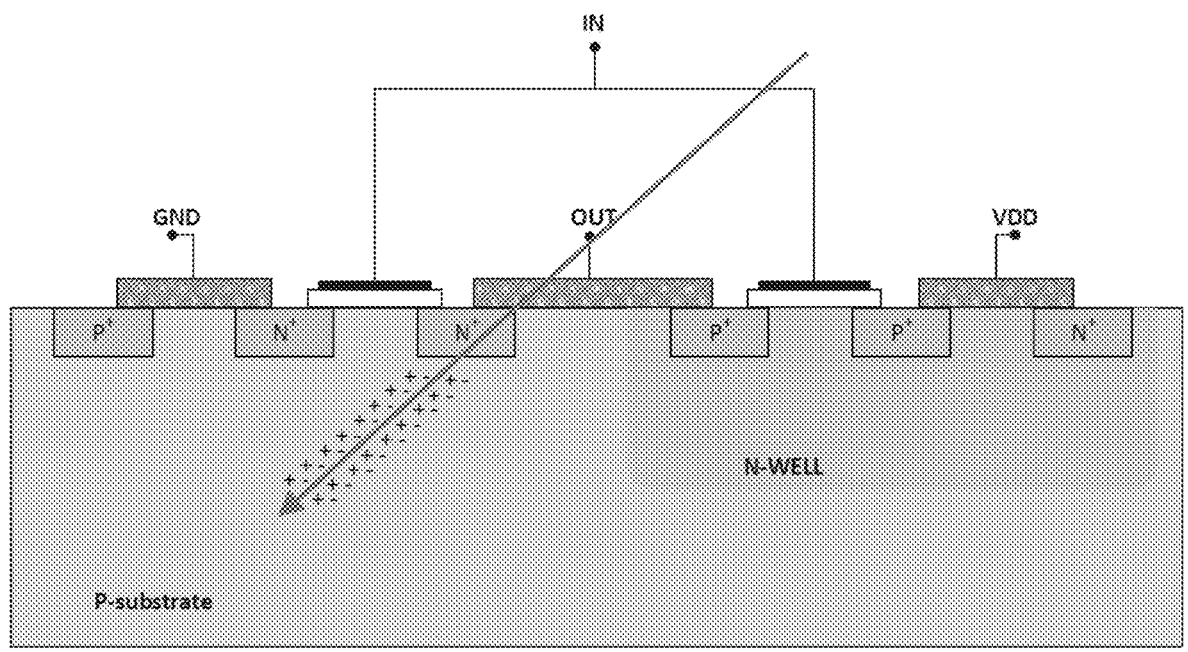
FIGURE 1
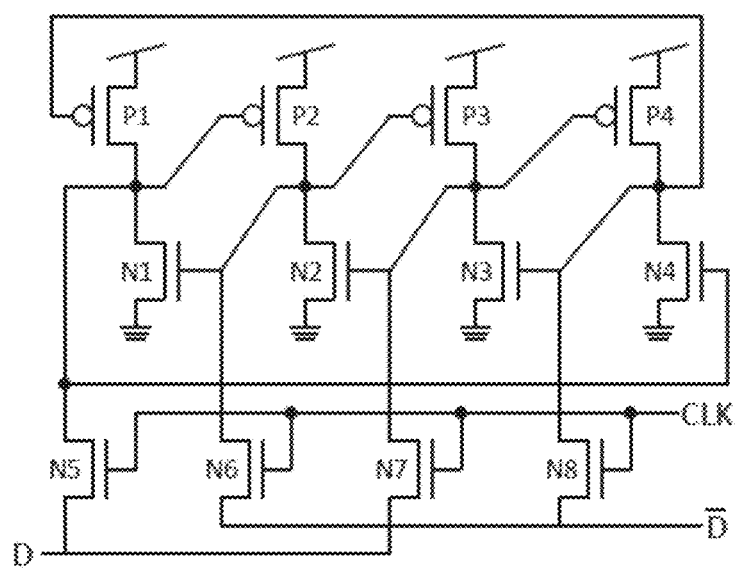
FIGURE 2A – Prior Art

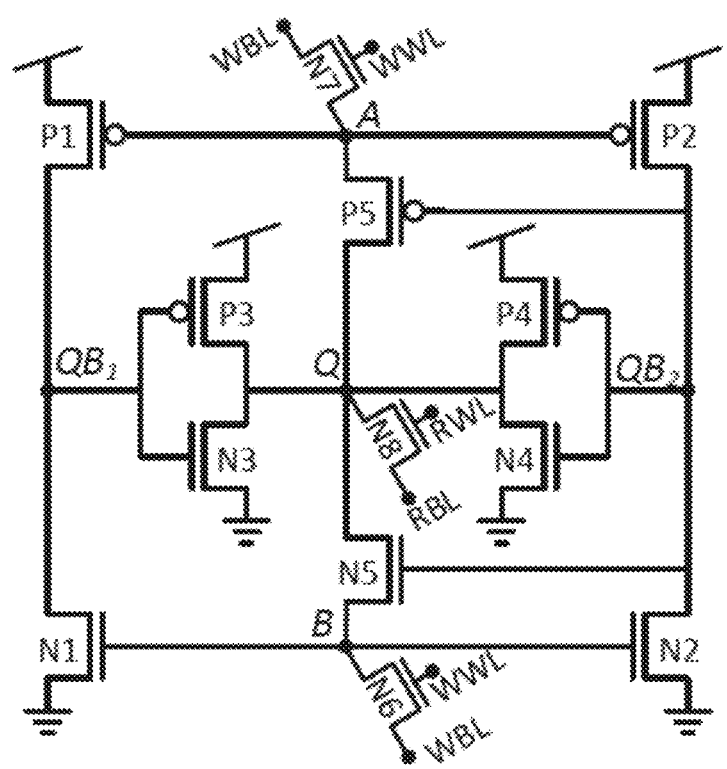
FIGURE 2B – Prior Art
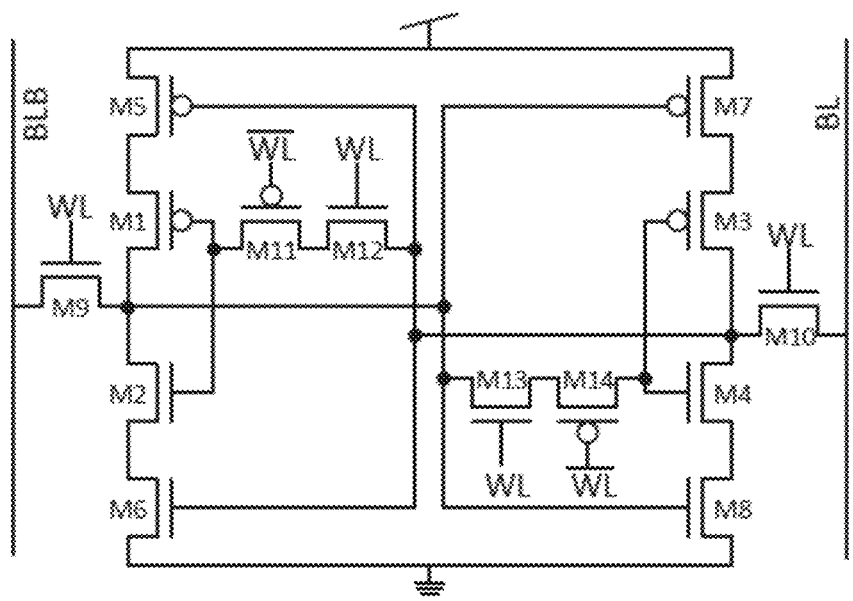
FIGURE 2C – Prior Art

COMPLEMENTARY DUAL-MODULAR REDUNDANCY MEMORY CELL

RELATED APPLICATIONS

This application is a National Phase of PCT Patent Application No. PCT/IL2017/051059 having International filing date of Sep. 19, 2017, which claims the benefit of priority under 35 USC § 119(e) of U.S. Provisional Patent Application No. 62/396,256 filed on Sep. 19, 2016. The contents of the above applications are all incorporated by reference as if fully set forth herein in their entirety.

FIELD AND BACKGROUND OF THE INVENTION

The present invention, in some embodiments thereof, relates to a memory cell and, more particularly, but not exclusively, to a 4-transistor memory cell.

In accordance with Moore's Law, the size, density, and power consumption of static random-access memories (SRAMs) has grown exponentially over the past four and a half decades. This trend is expected to continue, as SRAMs occupy over 50% of the total area and static power consumption of high performance microprocessors and are one of the primary components of most types of modern ASICs. Traditionally, the primary goals of SRAM design were density and high performance, whereas power was a secondary concern and stability was easily achieved. However, at deep sub-micron technologies, frequency has been replaced by power and stability as the primary factors in SRAM design. As device dimensions continue to scale, conventional SRAM memories experience poor read and write stabilities, resulting in an ever growing error rate. This results of higher process variations and device mismatch, lowering the static noise margins of SRAM memories, resulting in a higher susceptibility to noise. Furthermore, embedded memory arrays are often operated at highly scaled supply voltages in order to reduce their power consumption, which results in even lower noise margin and a much higher susceptibility to radiation effects, such as soft errors or single event upsets (SEUs).

SEUs occur when an energetic particle passes through a silicon substrate and its energy is transferred into the creation of electron-hole pairs along its path, as illustrated in FIG. 1. When such a particle hits a reversed-biased junction inside a storage node, the resulting transient current pulse may inject enough charge into the junctions to cause a data flip of a memory cell.

Embedded memory errors are typically handled at an architectural level using redundancy schemes, such as error correcting codes (ECCs) and triple modular redundancy (TMR). However, these solutions are extremely costly in terms of area overhead, while also adding complexity and delay, and are incompatible with sub-threshold operating memories. Furthermore, conventional error correction codes (ECCs) can only detect two errors and correct a single bit, otherwise requiring an even larger area overhead and complexity. Circuit level techniques such as DICE and Quatro 10T may efficiently increase SEU tolerance, however they require a much higher transistor-count, resulting in an even larger area and power consumption of these memory arrays.

Virtually all of the previously proposed solutions for error tolerant embedded memories are based on SRAM technology, adding additional devices and area consumption to the standard six transistors (6T) that are at the core of these memory arrays. One increasingly popular alternative to SRAM is gain cell embedded DRAM (GC-eDRAM), which offers much smaller area, lower leakage, and the option of low voltage operation. The main drawback of GC-eDRAM is the need for periodic refresh cycles to ensure data retention. However, it has been shown that its retention power, which is the sum of leakage and refresh power, may be lower than the leakage power of a conventional 6T SRAM cell.

State of the art error tolerant solutions can be divided to two approaches, circuit and architectural levels. Circuit level solutions are implemented by modification of the memory cell with increased noise margins, resulting in higher robustness to failures. In addition, SEUs tolerance may be improved by multiplication of the storage nodes and increased critical charge, thus enabling the recovery of the data following SEUs. Architecture level solutions include various error correcting schemes, mostly implemented by error correction codes. ECCs may be integrated without any modification to the memory array and are capable of correcting several errors according to the ECCs scheme used. In fact, ECCs are integrated in most embedded memories today.

Circuit Level Solutions

The conventional 6T SRAM memory cell utilizes an active feedback loop between cross-coupled inverters in order to retain its stored data value. This circuit is very sensitive to SEUs, as any upset that causes one of the data nodes to cross the switching threshold of the adjacent inverter will result in a bit flip. This failure risk increases with process scaling, where the critical charge of the memory cell decreases resulting in a higher soft error rates (SERs). Furthermore, static noise margins decrease significantly and therefore the memory cell is more susceptible to read and write errors. In addition, SRAM design for low-voltage operation has become increasingly popular over the past few years. However, when operating at low voltages, the switching threshold decreases, thereby increasing the circuit's error susceptibility. Various bitcell designs have been proposed to improve the noise margins of the cell in order to be compatible with low-voltage operation at scaled CMOS nodes. These designs generally incorporate the addition of a number of transistors into the bitcell topology, trading off density with robust, low-voltage functionality. However they do not offer self error detection and correction capability.

Many alternative error-tolerant SRAM circuits have been proposed in recent years. These solutions are directly aimed at improving the soft error susceptibility. Recently proposed error tolerant designs include the temporal latch, DICE, the Quatro-10T and 12T bitcells, the 13T sub-threshold bitcell, and SHIELD. These solutions may be fabricated in commercially available state-of-the-art manufacturing processes at the expense of an increase in the silicon area of the bitcell. The following three solutions reported high error tolerance and incorporate low-voltage operation.

1) DICE: The dual interlocked storage cell (DICE) is the best known SEU hardened bitcell. The concept of the DICE design is using the dual modular redundancy (DMR) of its internal circuit nodes to achieve immunity to errors affecting a single node. This is achieved with 12 transistors, implementing a dual node feedback control mechanism, as seen in FIG. 2A. The storage element utilizes four internal circuit nodes to store one memory bit. When a single event temporarily upsets one of these four nodes, only one additional node is affected by the upset through positive feedback. In this way a single node upset (SNU) will not propagate the error to the other nodes, and the unaffected nodes can correct the circuit value. However, it still remains sensitive to multi-node upsets (MNU) and also suffers from high power consumption, due to its many transistors and leakage paths. Additionally, the cell recovery time severely increases with supply voltage scaling, making the DICE bitcell inefficient for ultra low power (ULP) operation.

2) The 13T and SHIELD: While all of the previously proposed rad-hard bitcells were designed for error resilience under nominal supply voltages, the circuits proposed in "A 13T radiation hardened SRAM bitcell for low-voltage operation," by L. Atias, A. Teman, and A. Fish [25] and in "A novel low power bitcell design featuring inherent seu prevention and self correction capabilities," by O. Chertkow, A. Pescovsky, L. Atias, and A. Fish [26] specifically target ULP space applications, operated at scaled voltages. The 13T bitcell, shown in FIG. 2B, achieves radiation hardening by employing a dual-feedback, separated storage mechanism to overcome the increased vulnerability due to supply voltage scaling. By driving the acute data level with a pair of equipotentially driven, but independent, inverters, a strong, dual-driven feedback mechanism is applied with node separation for SEU protection. This setup effectively protects Q from an upset on QB1 or QB2, while achieving a high critical charge at node Q. The 13T bitcell was shown to be fully functional at sub-threshold voltages in [25] for a 0.18 μm implementation.

Another approach to ULP rad-hard operation is taken by the SHIELD bitcell [26], shown in FIG. 2C. This bitcell uses a pair of gated inverters (M5-M1-M2-M6 and M7-M3-M4-M8) to mitigate SEUs. These inverters incorporate an additional input gate that dynamically latches the previous output state when the primary and secondary inputs are different. A pair of these gated inverters is cross-coupled through a cutoff network (M11-M12 and M13-M14) to provide radiation tolerance. This results in two sets of separate dual-data nodes, which exhibit high SEU tolerance under scaled supply voltages.

Architectural Solutions

The main approach to error mitigation over the past two decades has been to provide full immunity to errors through circuit redundancy. The simplest way of error detection is using an additional parity bit, indicating whether a single error has occurred by comparing the parity of the stored data in the word to the parity bit. While this method is simple and requires minimal area cost, it can only detect up to one error per word and cannot correct it. For large memory arrays, ECCs can be used to detect and correct data errors in the memory array. They are typically implemented by the addition of extra bits per word and encoding the data to be able to detect and correct several bits, based on the used code. The number of bits which can be corrected comes in the expense of complexity and area overhead. One of the mostly used ECCs is single error correcting (SEC) Hamming code, which has the ability to correct single upsets with a reduced area and performance overhead. However, single error correcting ECCs may not be sufficient to meet reliability goals. Extended Hamming codes enable a single error correction-double error detection (SECDED). However, multiple errors occurring in a single word cannot be corrected. More advanced ECCs schemes include Reed-Solomon encoding and decoding, which enables the error correction and detection of multiple errors. Although this code copes with multiple errors, it does not correct double faults located in two adjacent blocks; which requires the use of Reed-Solomon code with double block correction capability. The cost of double block correction code is too high compared to the single block correction code, which makes this alternative inappropriate for hardware implementation.

The most popular technique in use today involves replicating a storage node three times and adding a three-input majority gate to filter out unwanted SEUs. This technique assumes that the probability of an error at two separate places on the chip within a defined time span is extremely low. When a single error occurs at any of the three storage nodes, a three-input majority gate acts as a voting circuit to recover the correct value. TMR is popular among ASIC and FPGA designers, since it does not introduce any new circuit elements to the existing standard cell library. However, TMR requires an increase in both area and power of at least 3×. In addition, TMR institutes a non-negligible delay overhead, due to the triplication of the sequential cells and the addition of the delay elements and majority gate.

Additional Background Art Includes:

[1] "International technology roadmap for semiconductors—2012 update," 2012. [Online]. Available: www(dot)itrs(dot)net

[2] C. Constantinescu, "Trends and challenges in vlsi circuit reliability," IEEE micro, no. 4, pp. 14-19, 2003.

[3] R. Baumann, "Soft errors in advanced computer systems," Design & Test of Computers, IEEE, vol. 22, no. 3, pp. 258-266, 2005.

[4] R. C. Baumann, "Radiation-induced soft errors in advanced semiconductor technologies," Device and Materials Reliability, IEEE Transactions on, vol. 5, no. 3, pp. 305-316, 2005.

[5] P. E. Dodd and L. W. Massengill, "Basic mechanisms and modeling of single-event upset in digital microelectronics," Nuclear Science, IEEE Transactions on, vol. 50, no. 3, pp. 583-602, 2003.

[6] M. Bajura, Y. Boulghassoul, R. Naseer, S. DasGupta, A. F. Witulski, J. Sondeen, S. D. Stansberry, J. Draper, L. W. Massengill, J. N. Damoulakis et al., "Models and algorithmic limits for an ecc-based approach to hardening sub-100-nm srams," Nuclear Science, IEEE Transactions on, vol. 54, no. 4, pp. 935-945, 2007.

[7] J. Maiz, S. Hareland, K. Zhang, and P. Armstrong, "Characterization of multi-bit soft error events in advanced srams," in Electron Devices Meeting, 2003. IEDM'03 Technical Digest. IEEE International. IEEE, 2003, pp. 21-4.

[8] L. Sterpone and M. Violante, "Analysis of the robustness of the tmr architecture in sram-based fpgas," Nuclear Science, IEEE Transactions on, vol. 52, no. 5, pp. 1545-1549, 2005.

[9] C.-L. Chen and M. Hsiao, "Error-correcting codes for semiconductor memory applications: A state-of-the-art review," IBM Journal of Research and Development, vol. 28, no. 2, pp. 124-134, 1984.

[10] T. Calin, M. Nicolaidis, and R. Velazco, "Upset hardened memory design for submicron cmos technology," IEEE-Transactions-on-Nuclear-Science, pp. 2874-8, 1996.

[11] S. M. Jahinuzzaman, D. J. Rennie, and M. Sachdev, "A soft error tolerant 10t sram bit-cell with differential read capability," Nuclear Science, IEEE Transactions on, vol. 56, no. 6, pp. 3768-3773, 2009.

[12] P. Meinerzhagen, A. Teman, R. Giterman, A. Burg, and A. Fish, "Exploration of sub-vt and near-vt 2t gain-cell memories for ultra-low power applications under technology scaling," Journal of Low Power Electronics and Applications, vol. 3, no. 2, pp. 54-72, 2013.

[13] A. Teman, P. Meinerzhagen, R. Giterman, A. Fish, and A. Burg, "Replica technique for adaptive refresh timing of gain-cell-embedded dram," Circuits and Systems II: Express Briefs, IEEE Transactions on, vol. 61, no. 4, pp. 259-263, 2014.

[14] Chun et al., in Proc. of IEEE ISCAS, 2010.

[15] B. H. Calhoun and A. P. Chandrakasan, "Static noise margin variation for sub-threshold sram in 65-nm cmos," Solid-State Circuits, IEEE Journal of, vol. 41, no. 7, pp. 1673-1679, 2006.

[16] , "A 256-kb 65-nm sub-threshold sram design for ultra-low-voltage operation," Solid-State Circuits, IEEE Journal of, vol. 42, no. 3, pp. 680-688, 2007.

[17] A. Teman, L. Pergament, O. Cohen, and A. Fish, "A 250 mv 8 kb 40 nm ultra-low power 9t supply feedback sram (sf-sram)," Solid-State Circuits, IEEE Journal of, vol. 46, no. 11, pp. 2713-2726, November 2011.

[18] N. Verma and A. Chandrakasan, "A 256 kb 65 nm 8t subthreshold sram employing sense-amplifier redundancy," Solid-State Circuits, IEEE Journal of, vol. 43, no. 1, pp. 141-149, January 2008.

[19] B. H. Calhoun et al., "A 256-kb 65-nm sub-threshold SRAM design for ultra-low-voltage operation," Solid-State Circuits, IEEE Journal of, vol. 42, no. 3, pp. 680-688, 2007.

[20] J. P. Kulkarni et al., "A 160 mV robust schmitt trigger based subthreshold SRAM," Solid-State Circuits, IEEE Journal of, vol. 42, no. 10, pp. 2303-2313, 2007.

[21] D. G. Mavis and P. H. Eaton, "Soft error rate mitigation techniques for modern microcircuits," in IEEE international reliability physics symposium, 2002, pp. 216-225.

[22] T. Calin, M. Nicolaidis, and R. Velazco, "Upset hardened memory design for submicron CMOS technology," IEEE Transactions on Nuclear Science, vol. 43, no. 6, pp. 2874-2878, 1996.

[23] S. M. Jahinuzzaman, D. J. Rennie, and M. Sachdev, "A soft error tolerant 10T SRAM bit-cell with differential read capability," IEEE Transactions on Nuclear Science, vol. 56, no. 6, pp. 3768-3773, 2009.

[24] M. Shayan, V. Singh, A. D. Singh, and M. Fujita, "SEU tolerant robust memory cell design," in Proc. IEEE IOLTS '12. IEEE, 2012, pp. 13-18.

[25] L. Atias, A. Teman, and A. Fish, "A 13T radiation hardened SRAM bitcell for low-voltage operation," in Proc. IEEE S3S '13, 2013, pp. 1-2.

[26] 0. Chertkow, A. Pescovsky, L. Atias, and A. Fish, "A novel low power bitcell design featuring inherent seu prevention and self correction capabilities," Journal of Low Power Electronics and Applications, vol. 5, no. 2, pp. 130-150, 2015.

[27] R. Hentschke, F. Marques, F. Lima, L. Carro, A. Susin, and R. Reis, "Analyzing area and performance penalty of protecting different digital modules with hamming code and triple modular redundancy," in Integrated Circuits and Systems Design, 2002. Proceedings. 15th Symposium on. IEEE, 2002, pp. 95-100.

[28] G. Neuberger, F. De Lima, L. Carro, and R. Reis, "A multiple bit upset tolerant sram memory," ACM Transactions on Design Automation of Electronic Systems (TODAES), vol. 8, no. 4, pp. 577-590, 2003.

[29] R. Garg, N. Jayakumar, S. P. Khatri, and G. S. Choi, "Circuit-level design approaches for radiation-hard digital electronics," Very Large Scale Integration (VLSI) Systems, IEEE Transactions on, vol. 17, no. 6, pp. 781-792, 2009.

[30] P. E. Dodd, "Physics-based simulation of single-event effects," Device and Materials Reliability, IEEE Transactions on, vol. 5, no. 3, pp. 343-357, 2005.

[31] C. W. Slayman, "Cache and memory error detection, correction, and reduction techniques for terrestrial servers and workstations," Device and Materials Reliability, IEEE Transactions on, vol. 5, no. 3, pp. 397-404, 2005.

[32] R. Giterman, A. Teman, P. Meinerzhagen, A. Burg, and A. Fish, "4t gain-cell with internal-feedback for ultra-low retention power at scaled cmos nodes," in Circuits and Systems (ISCAS), 2014 IEEE International Symposium on. IEEE, 2014, pp. 2177-2180.

[33] G. Srinivasan, P. Murley, and H. Tang, "Accurate, predictive modeling of soft error rate due to cosmic rays and chip alpha radiation," in Proc. IEEE Reliability Physics Symposium. IEEE, 1994, pp. 12-16.

[34] P. Dodd and F. Sexton, "Critical charge concepts for CMOS SRAMs," IEEE Transactions on Nuclear Science, vol. 42, no. 6, pp. 1764-1771, 1995.

SUMMARY OF THE INVENTION

Embodiments of the complementary dual-modular redundancy (CDMR) memory cell presented herein include two bitcells which store complementary data levels. During a write operation, the data level being stored is written to one bitcell and the complementary data level is written to the second bitcell. When a read operation is performed, the data level is read from both bitcells. A comparator then compares the two read data levels. If these two levels are not complementary, the comparator outputs an indicator which serves as an alert that a storage error has (or may have) occurred. Further error detection and/or error correction techniques may then be employed on the data read from the CDMR memory cell. In further embodiments a memory array is formed from multiple complementary CDMR memory cells, according to any memory array architecture known in the art.

According to an aspect of some embodiments of the present invention there is provided a memory cell, which includes:
 a data write input, configured to input data levels for storing in the memory cell;
 a data read output;
 an indicator output;
 a first bitcell connected to the data write input and the data read output, configured to store a first data level input from the data write input and to output a first read data level to the data read output; and
 a second bitcell connected to the data write input, configured to store a second data level input from the data write input to output a second read data level; and
 a comparator associated with the first bitcell, the second bitcell and the indicator output, configured to compare a data level read from the first bitcell and a data level read from the second bitcell and to provide, at the indicator output, an indicator when the first read data level and the second read data level are non-complementary.

According to some embodiments of the invention, the first and second data levels are input at the data write input in series.

According to some embodiments of the invention, the first and second data levels are input at the data write input in parallel.

According to some embodiments of the invention, the memory cell further includes at least one processor adapted to execute code instructions to provide the first data level to the first bitcell and a complementary data level to the second bitcell.

According to some embodiments of the invention, the memory cell further includes an inverter connected to the data write input, configured to invert the first data level and to provide the inverted data level as the second data level to the second bitcell.

According to some embodiments of the invention, the memory cell further includes at least one processor adapted to execute code instructions to determine, in accordance with the indicator, a correct data level from at least one of the read data levels.

According to some embodiments of the invention, the memory cell further includes a parity bit, and code instructions for execution by at least one processor for determining a correct data level use the parity bit for the correcting.

According to some embodiments of the invention, the memory cell is a static memory.

According to some embodiments of the invention, the memory cell is a dynamic memory.

According to some embodiments of the invention, write operations for the first and second bitcells are triggered from a write trigger input and read operations for the first and second bitcells are triggered from a read trigger input.

According to some embodiments of the invention, the first bitcell and the second bitcell include respective write transistors triggered from a write trigger input and respective read transistors triggered from a read trigger input.

According to some embodiments of the invention, the write transistors of the first and second bitcells are the same transistor type.

According to some embodiments of the invention, the read transistors of the first and second bitcells are the same transistor type.

According to some embodiments of the invention, all the transistors of the first and second bitcells are the same transistor type.

According to some embodiments of the invention, all the transistors of the first and second bitcells are gain cell embedded DRAM (GC-eDRAM) transistors.

According to some embodiments of the invention:
the data write input is configured to input the first and the second data levels in parallel to the respective first and second bitcells;
the first bitcell includes a write transistor and a read transistor, and wherein: a first diffusion connection of the write transistor is connected to the data write input, a gate connection of the write transistor is connected to a write trigger input, a first diffusion connection of the write transistor is connected to a first comparator input, a second diffusion connection of the write transistor is connected to a write trigger input, and a second diffusion connection of the write transistor is connected to a gate connection of the read transistor to form a first storage node; and
the second bitcell includes a write transistor and a read transistor, and wherein: a first diffusion connection of the write transistor is connected to the data write input, a gate connection of the write transistor is connected to the write trigger input, a first diffusion connection of the write transistor is connected to a second comparator input, a second diffusion connection of the write transistor connected to the write trigger input, and a second diffusion connection of the write transistor is connected to a gate connection of the read transistor to form a second storage node.

According to some embodiments of the invention, the first bitcell comprises a read bit line output configured to output the first read data level read from the first bitcell.

According to some embodiments of the invention, all of the first bitcell transistors and the second bitcell transistors are gain cell embedded GC-eDRAM transistors.

According to an aspect of some embodiments of the present invention there is provided a memory array which includes:
a data write input port, configured to input data levels for storing in the array;
a data read output port, configured to output data levels from the memory array;
an indicator output port;
multiple memory cells, each of the memory cells comprising:
a first bitcell connected to the data write input port and the data read output port, configured to store first data levels and to output first read data levels; and
a second bitcell connected to the data write input port, configured to store second data levels and to output a second read data levels; and
at least one comparator, configured to compare respective first and second read data levels a selected memory cell and to provide, at the indicator output port, a respective indicator when the first read data level and the second read data level are non-complementary.

According to some embodiments of the invention, the memory array further includes at least one non-transitory computer readable storage medium storing instructions and at least one processor configured to execute the instructions to provide, at the write input port, first data levels for storing in the first bitcells and complementary data levels for storing in respective second bitcells.

According to some embodiments of the invention, the memory array further includes at least one non-transitory computer readable storage medium storing instructions and at least one processor configured to execute the instructions to correct memory cell errors by applying error correction logic to at least one data level read from a memory cell and a respective indicator.

According to some embodiments of the invention, the memory array further includes a parity array comprising at least one parity bit per column of the memory cells, wherein the error correction logic uses the parity array for the correcting the memory cell read errors.

According to some embodiments of the invention, the memory array is a static memory array.

According to some embodiments of the invention, the memory array is a dynamic memory array.

According to some embodiments of the invention, the first bitcells and the second bitcells are stored in different rows of the memory array.

According to some embodiments of the invention, the first bitcells and the second bitcells are stored in different portions of the memory array.

According to an aspect of some embodiments of the present invention there is provided a method which includes:
providing a memory cell comprising:
a first bitcell configured to store a first input data level and to output the stored first data level to a data read output; and
a second bitcell configured to store a second input data level;
storing a first data level in the first bitcell and a complementary data level in the second bitcell;
reading first and second data levels from the first and second bitcells respectively; and
providing an indicator when first and second read data levels are non-complementary.

According to some embodiments of the invention, the method further includes performing error correction on the first and second read data levels to determine a correct first data level when the indicator is provided.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 illustrates a particle strike hitting a silicon substrate junction;

FIG. 2A is a simplified layout of a DICE bitcell;

FIG. 2B is a simplified layout of a 13T radiation hardened SRAM;

FIG. 2C is a simplified layout of a SHIELD SRAM;

DESCRIPTION OF SPECIFIC EMBODIMENTS OF THE INVENTION

Figure 3A:
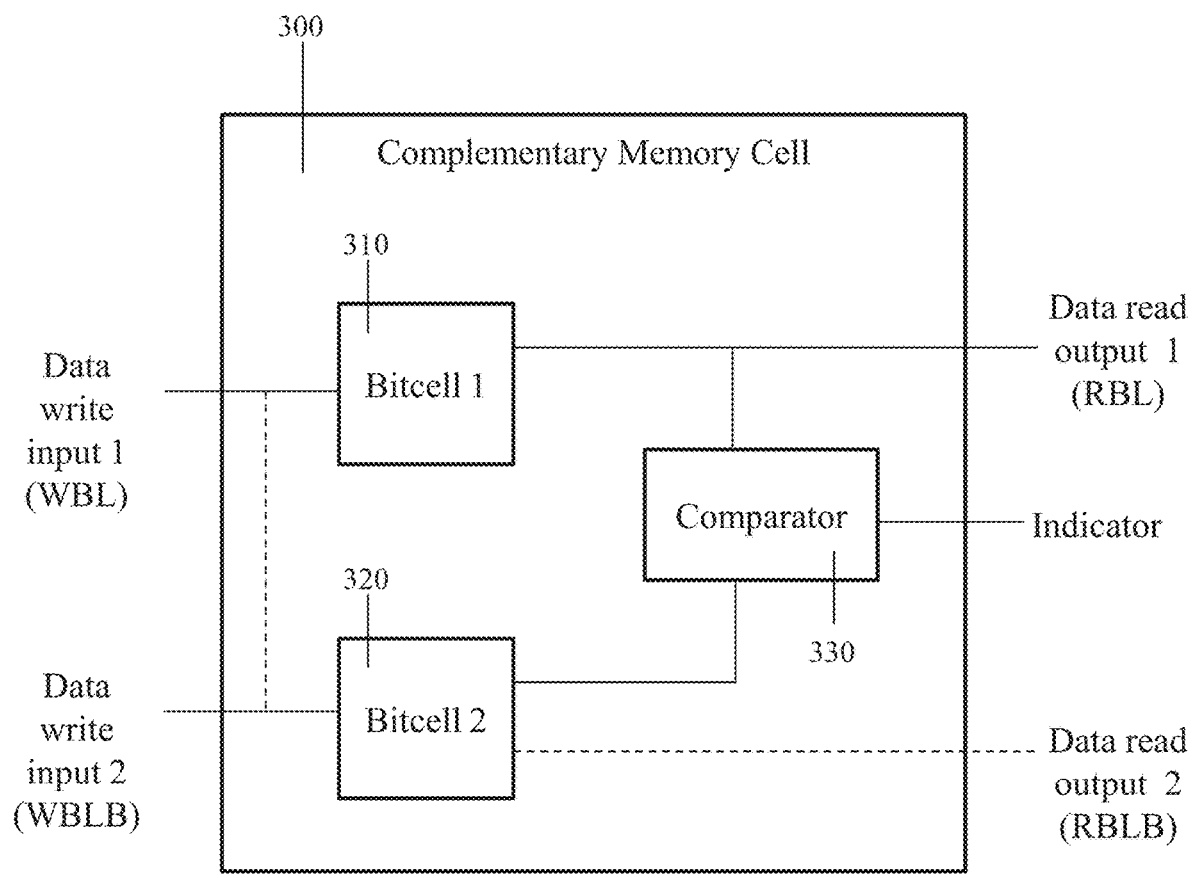
FIG. 3A is a simplified block diagram of a CDMR memory cell, according to embodiments of the invention.

The present invention, in some embodiments thereof, relates to a CDMR memory cell and, more particularly, but not exclusively, to a 4-transistor CDMR memory cell.

Embodiments of the CDMR memory cell presented herein include two bitcells which store complementary data levels. One of the bitcells holds the actual data level being stored and the other bitcell holds the complementary data level. When a read operation is performed, a comparator compares the data levels read from the two bitcells contained in the CDMR memory cell. If these two levels are not complementary, the comparator outputs an indicator which serves as an alert that a storage error has (or may have) occurred. Further error detection and/or error correction techniques may then be employed on the data read from the CDMR memory cell.

In the most general case, the indicator does not detect storage errors with 100% probability. If an error occurs in both bitcells, the output levels will still be complementary and no error will be indicated. However, for some transistor types an error in both bitcells is unlikely, and relatively simple error detection and correction logic may be used to determine the correct data level.

As used herein the terms "complementary dual-modular redundancy memory cell", "CDMR memory cell" and "memory cell" mean a one-bit memory which stores two data level values, where each data level may be read independently without changing the other data level. Optionally the two data levels are stored in respective bitcells.

As used herein the term "bitcell" means a one-bit memory.

As used herein the terms "complementary data level" means the data level of the opposite logic value. For example, if the data level stored in the first bitcell corresponds to a logic "0" the complementary data level corresponds to a logic "1".

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

I. CDMR Memory Cell

Referring now to the drawings, FIG. 3A is a simplified block diagram of a CDMR memory cell, according to embodiments of the invention. CDMR memory cell 300 includes two bitcells, 310 and 320, and comparator 330. For correct operation of the CDMR memory cell, the data level of the data actually being stored is written to bitcell 310 and the complementary data level is written to bitcell 320.

When a read operation is performed, comparator 330 compares the data level read from said first bitcell to the data level read from the second bitcell. Comparator 330 outputs an indicator which shows if the two read data levels are or are not complementary. If the data level in a single bitcell has flipped, the indicator will show that the data levels are not complementary. Optionally, an indicator showing non-complementary levels serves as an alert that error detection and/or error correction and/or other operations should be performed.

Optionally, the comparator is an XOR gate which compares logic levels read from memory cell. Alternately, the comparator is an analog comparator which compares analog levels output from the memory cell.

Comparator 330 may be located adjacent to the bitcells, or may be located in a different location on the circuit (e.g. ASIC).

Optionally, the timing of the read and/or write operations are controlled to ensure that in each read cycle corresponding data levels are provided to comparator 330 for comparison (so that the data level written to bitcell 320 was complementary to the data written to bitcell 310 and therefore should be complementary at read time).

Optionally, the data write input includes separate input lines for bitcells 310 and 320, and the complementary data levels are provided to the memory cell in parallel to be stored in the memory cell in a single cycle. Alternately, the complementary data levels are provided to memory cell 300 in series via a single input line and stored in the respective bitcell in separate cycles. Optionally, CDMR memory cell 300 includes an inverter. In the exemplary embodiment shown in FIG. 3B, inverter 340 inverts the logic level at WBL, thereby obtaining the complementary data level, and provides the complementary data level to bitcell 320. There is then no need to provide the complementary data level separately to WBLB.

Optionally, based on the indicator, error detection and/or correction operations are performed on the data levels read from one or both of bitcells 310 and 320. The memory detection and/or correction operations may be performed by any suitable techniques known in the art.

Optionally, CDMR memory cell 300 includes, or is associated with, a parity bit and the error detection and/or correction operations use the parity bit. Optionally, the parity bit is stored in a parity bitcell which is integrated in CDMR memory cell 300. Alternately or additionally, the parity bit is stored externally to CDMR memory cell 300.

Optionally, the parity bit is stored in a separate CDMR memory cell. Alternately or additionally, the parity bit is stored in a different type of bitcell.

Optionally, other error detection and/or correction techniques known in the art are used for a single CDMR memory cell or for a memory array formed from multiple CDMR memory cells. These techniques may include using parity bit(s), data replication, error correction coding and so forth.

Optionally, CDMR memory cell 300 is a dynamic memory cell. Alternately, CDMR memory cell 300 is a static memory cell.

Figure 3B:
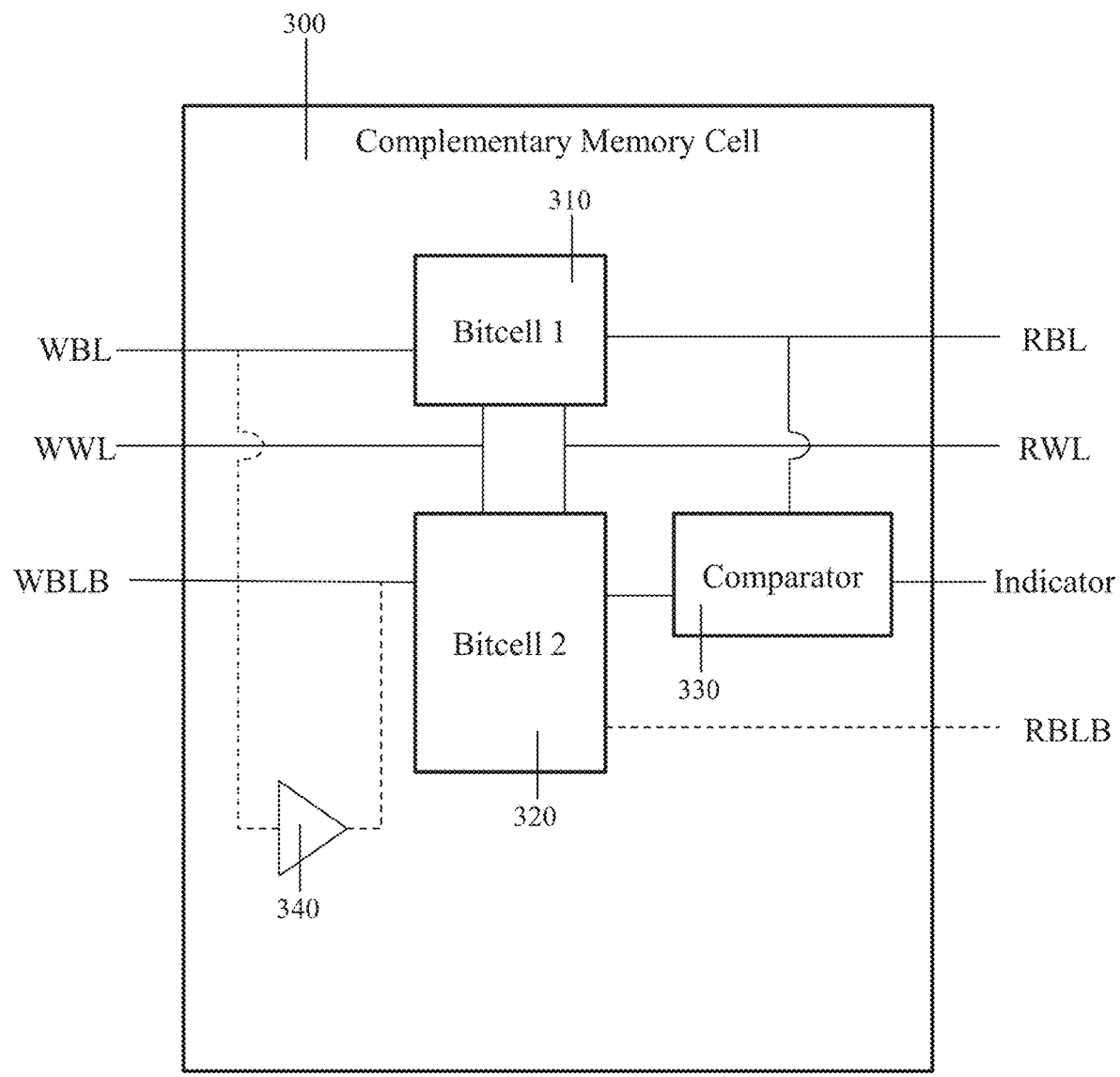
FIG. 3B is a simplified block diagram of a CDMR memory cell with read/write triggering, according to embodiments of the invention.

Reference is now made to FIG. 3B, which is a simplified block diagram of a CDMR memory cell with read write triggering, according to an exemplary embodiment of the invention. CDMR memory cell 305 includes two bitcells and a comparator configured as shown above, and additionally includes write and read trigger inputs (WWL and RWL respectively).

Bitcell 310 stores the data level which is at the data write input (WBL) during a write operation. Bitcell 320 stores the data level which is at the complementary data write input (WBLB) for the same write operation. Write operations to bitcells 310 and 320 are triggered by a common write trigger input (WWL). Read operations from bitcells 310 and 320 are triggered by a common write trigger input (RWL). The data read from bitcell 310 is output at data read output RBL. Optionally, CDMR memory cell 305 also includes a second data read output (RBLB) for bitcell 320.

When the CDMR memory cell does not include inverter 340 and the write operation is triggered by a common trigger (WWL), the data levels at WBL and WBLB should be complementary at the time of the write operation.

Optionally, write and read operations to CDMR memory cell 305 are performed in parallel.

Alternately, write and/or read operations to CDMR memory cell 305 are performed in series. Optionally, for parallel write operations, bitcells 310 and 320 are triggered independently by respective write triggers (i.e. not by common write trigger WWL as shown in FIG. 3B). Optionally, for parallel read operations, bitcells 310 and 320 are triggered independently by respective read triggers (i.e. not by common read trigger RWL as shown in FIG. 3B).

Optionally, bitcells 310 and 320 are two-transistor (2T) bitcells which include respective write and read transistors. Further optionally, write operations to the two write transistors are triggered together by a write trigger (e.g. WWL in FIG. 3B) and read operations from the two read transistors are triggered together by a read trigger (e.g. RWL in FIG. 3B).

Optionally the two write transistors are the same transistor type. Alternately or additionally, the two read transistors are the same transistor type.

Optionally, all four transistors are the same transistor type. Further optionally, all four transistors are gain cell embedded DRAM (GC-eDRAM) transistors.

Different embodiments of the CDMR memory cells may use different types of transistors. Optional types of transistors which may be used to construct the CDMR memory cell include, but are not limited to:
  i) Ultra-high Vt;
  ii) High Vt;
  iii) Regular Vt;
  iv) Low Vt;
  v) Ultra-low Vt;
  vi) Native; and
  vii) I/O NMOS/PMOS.

Embodiments of CDMR memory cells may be implemented in circuits, including, but not limited to:

a) An integrated circuit (IC) customized for a particular use, such as an Application-Specific Integrated Circuit (ASIC);

b) A programmable logic device intended for general-purpose use. Examples of such programmable logic devices include, but are not limited to: Field-Programmable Gate Array (FPGA), Gate Array, Uncommitted Logic Array (ULA), Programmable Logic Array (PLA), Programmable Array Logic (PAL), Complex Programmable Logic Device (CPLD), Erasable Programmable Logic Device (EPLD) and Structured ASIC.

II. Four Transistor (4T) CDMR Memory Cell

Optionally, the CDMR memory cell is a four-transistor (4T) memory cell which includes two 2T bitcells and a comparator. In the 4T embodiment, each of the bitcells includes a respective write transistor and a respective read transistor.

Figure 3C:
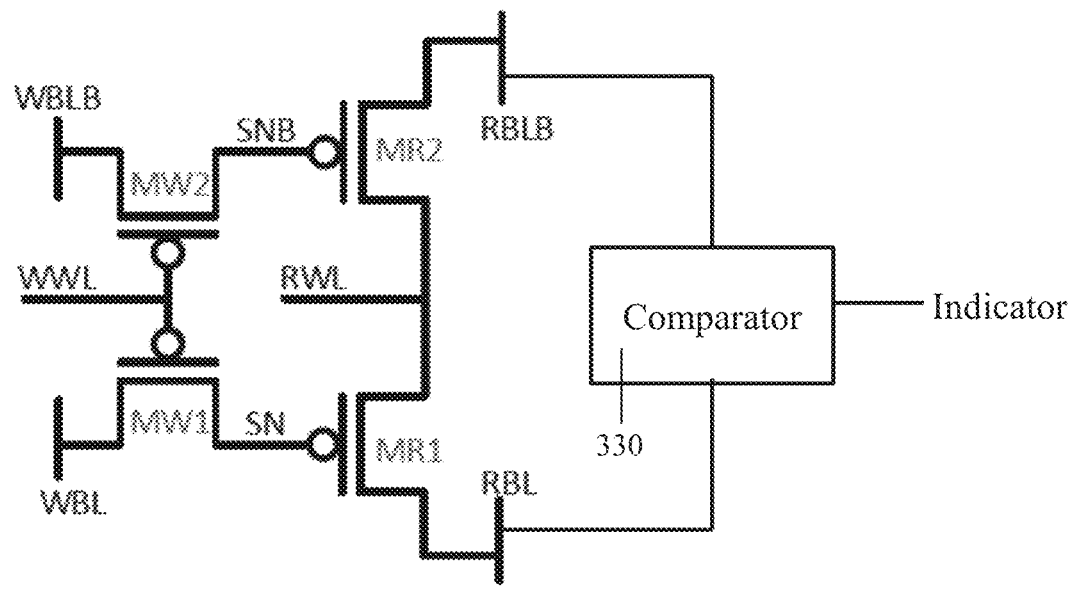
FIG. 3C is a simplified layout of a four transistor PMOS CDMR memory cell, according to embodiments of the invention.

Reference is now made to FIG. 3C, which is a simplified layout of a four transistor (4T) PMOS CDMR memory cell, according to exemplary embodiments of the invention. The 4T CDMR memory cell includes two write transistors (MW1, MW2) and two read transistors (MR1, MR2). The two read data levels, at RBL and RBLB, are provided to the comparator (not shown).

Figure 3D:
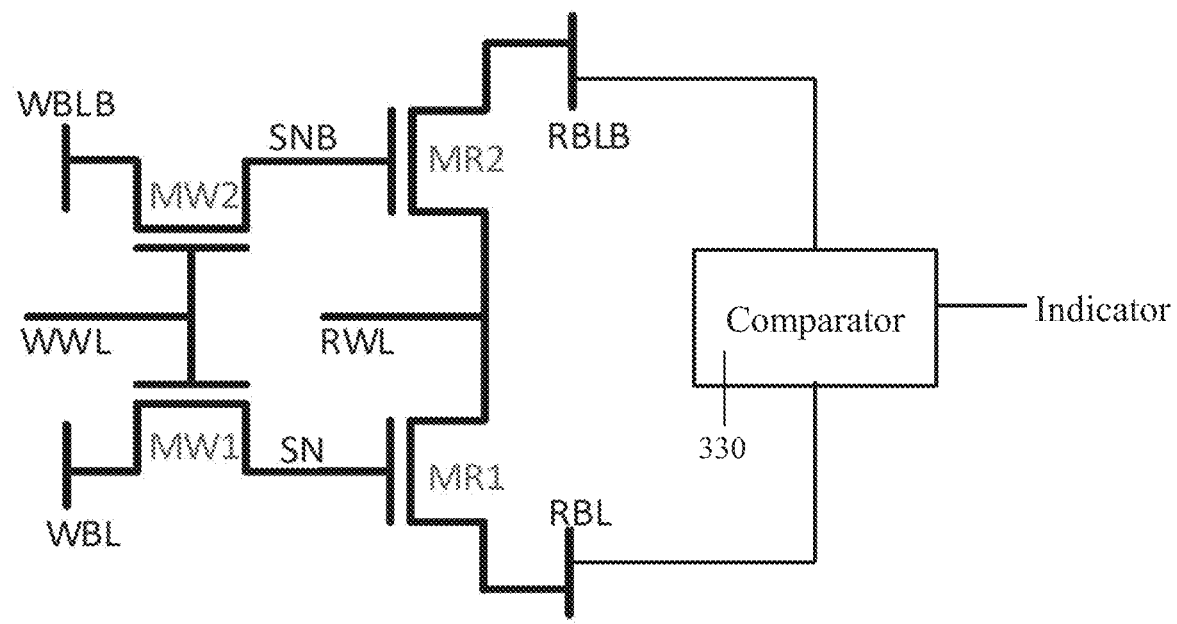
FIG. 3D is a simplified layout of a four transistor NMOS CDMR memory cell, according to embodiments of the invention.

FIG. 3D is a simplified layout of a 4T NMOS CDMR memory cell, according to exemplary embodiments of the invention. The layout of the NMOS CDMR memory cell is very similar to the NMOS layout, and includes two write transistors (MW1, MW2) and two read transistors (MR1, MR2) interconnected as shown in FIG. 3D.

During normal operation, the output of a read operation from the MR1 and MR2 would provide two opposite levels. Therefore, if both storage nodes provide the same read out level, it may be concluded (or suspected) that a read error has occurred.

The data and its complementary values are stored on the parasitic capacitances at the storage nodes (SN and SNB), comprising the gate capacitance of MR1/MR2 and the diffusion capacitance of MW1/MW2, respectively. Writing to the cell is performed by driving the write word line (WWL) to a negative voltage and passing the data and its complementary level from the write bit lines (WBL and WBLB) to SN and SNB, respectively. Readout is performed by pre-discharging the read bit lines (RBL and RBLB) to GND and driving the read word lines (RWL and RWLB) to VDD, thereby charging RBL/RBLB only if SN/SNB holds a data '0'. The RBL/RBLB of each column is connected to a sensing circuit, which may be implemented with a simple inverter, in order to output the digital levels of the data and its complementary level stored in the selected cell.

III. CDMR Memory Array

Figure 5:
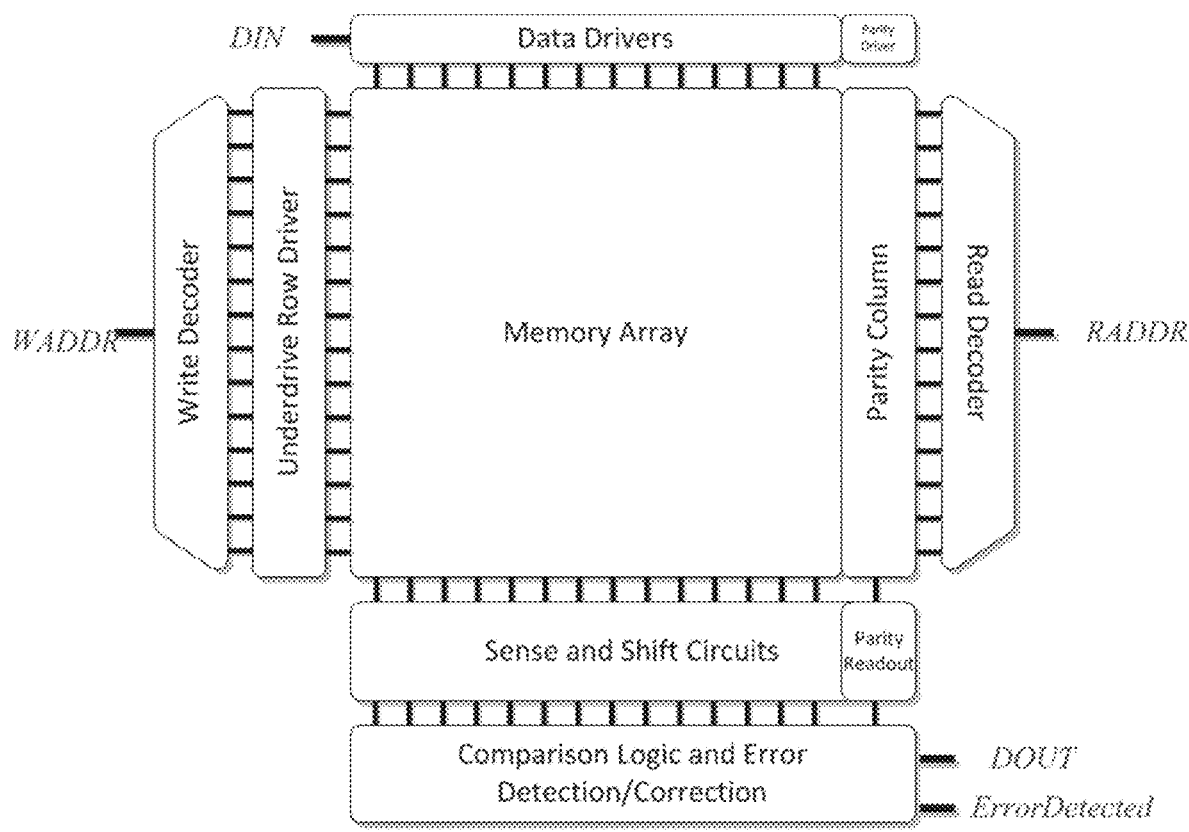
FIG. 5 is a simplified block diagram of a memory array of 4T CDMR memory cells, according to embodiments of the invention.

Optionally, CDMR memory cells are combined to form a CDMR memory array. The memory array architecture may be any architecture known in the art that is suitable for the type of transistors forming the CDMR memory cells. An exemplary embodiment of a memory array architecture is illustrated in FIG. 5 below.

The CDMR memory array includes multiple CDMR memory cells, each of which includes respective first and second bitcells for storing complementary logic levels. The CDMR memory array further includes one or more comparators which compare the data levels read from the first and second bitcells of a respective CDMR memory cell, and provides respective indicators showing when the read data levels are non-complementary.

There are multiple options for positioning the respective bitcell pairs within the memory array. Optional arrangements include:

i) The memory array is laid out as an array of CDMR memory cells, with the first and second bitcells interconnected within the respective memory cell.

ii) The first bitcells and the second bitcells are located on different rows of the memory array.

iii) The first bitcells and the second bitcells are located in different portions of the memory array.

iv) The first bitcells and the second bitcells are located on separate sub-arrays.

Optionally, the memory array is read in multi-bit data words along with a corresponding indicator word having a respective indicator for each bit in the data word.

Optionally, write bit line inputs of the memory cells are connected to form a common write bit line and respective complementary write bit line inputs of the memory cells are connected to form a common complementary write bit line.

In itself, the CDMR characteristic of the memory cells in the memory array provides a reduced area implementation with inherent error detection capabilities. However, while the location of the error is known, it is not inherently clear if the data or its complementary value was corrupted, which may prevent correction of the error. This may be addressed by adding a parity bit to each set of bits. If the parity is maintained despite the error, the complementary value of the erroneous bit (SNB) has been corrupted and should be corrected, while if the parity is incorrect, the SN value should be corrected.

Optionally, the CDMR memory array includes a parity array which stores at least one parity bit per column of CDMR memory cells. Error correction logic may use the parity array for the correcting the memory cell read errors.

Optionally, the CDMR memory array according to claim includes at least one processor which applies error correction logic to the data levels read from the CDMR memory cell in the array along with the respective indicators obtained from the comparator(s).

Optionally the CDMR memory array is a static memory. Alternately, the CDMR memory array is a dynamic memory.

IV. Exemplary 4T GC-eDRAM CDMR Memory Cell

Optionally, the 4T CDMR memory cell uses GC-eDRAM transistors. A 4T GC-eDRAM CDMR memory cell is robust against SEUs and data deterioration errors.

In general, the primary risk of an SEU triggered data flip in a conventional SRAM cell is due to the positive feedback between the two internal storage nodes. The SRAM structure is highly susceptible to a particle strike, as any voltage shift which causes one of the storage nodes to cross the switching threshold of the adjacent inverter will result in a bit flip.

Gain-cell eDRAM (GC-eDRAM) is a fully logic-compatible implementation of eDRAM, which provides a reduced silicon footprint as compared to SRAM, but lacks the internal feedback that ensures strong storage levels, in spite of deteriorating leakage currents. Intuitively, such a topology is much more susceptible to SERs, as the circuit lacks any mechanism to mitigate a level change induced by a particle strike. However, with complementary dual-modular redundancy both the data value and its inverse (i.e. complementary) value are stored for each bit. Based on this concept, SEUs in the CDMR memory cell or a CDMR memory array may be both detected and corrected, while still achieving the low area and power aspirations of the target applications.

The 4T GC-eDRAM CDMR memory cell lacks the internal feedback mechanism of the SRAM cell. Therefore, the complementary storage nodes (SN and SNB) are affected separately by a particle strike. In the case of a particle changing the data in one of the storage nodes, the complementary node will remain unaffected and both nodes will store the same data level. Therefore, by simply comparing the outputs (e.g. with an XOR gate) an error may be detected in any given bit.

For example, in the all-PMOS cell of FIG. 3C the only nodes susceptible to a strike are the reverse-biased p+n junctions at SN and SNB. For such a junction, only a positive voltage shift can occur due to a particle strike, and therefore only a stored data '0' may be flipped. If the particle strike occurs just after a write '0' operation to the cell, the level might get deteriorated and its retention time would get decreased. On the other hand, a particle strike close to the retention time of the cell will quite surely flip its state and cause an error during readout. On the other hand, a particle strike on a node storing a data '1' would only strengthen the stored level, since MR1 would be more cut off during a readout. Furthermore, its retention time would be increased as a result of the positive voltage shift.

Figure 4:
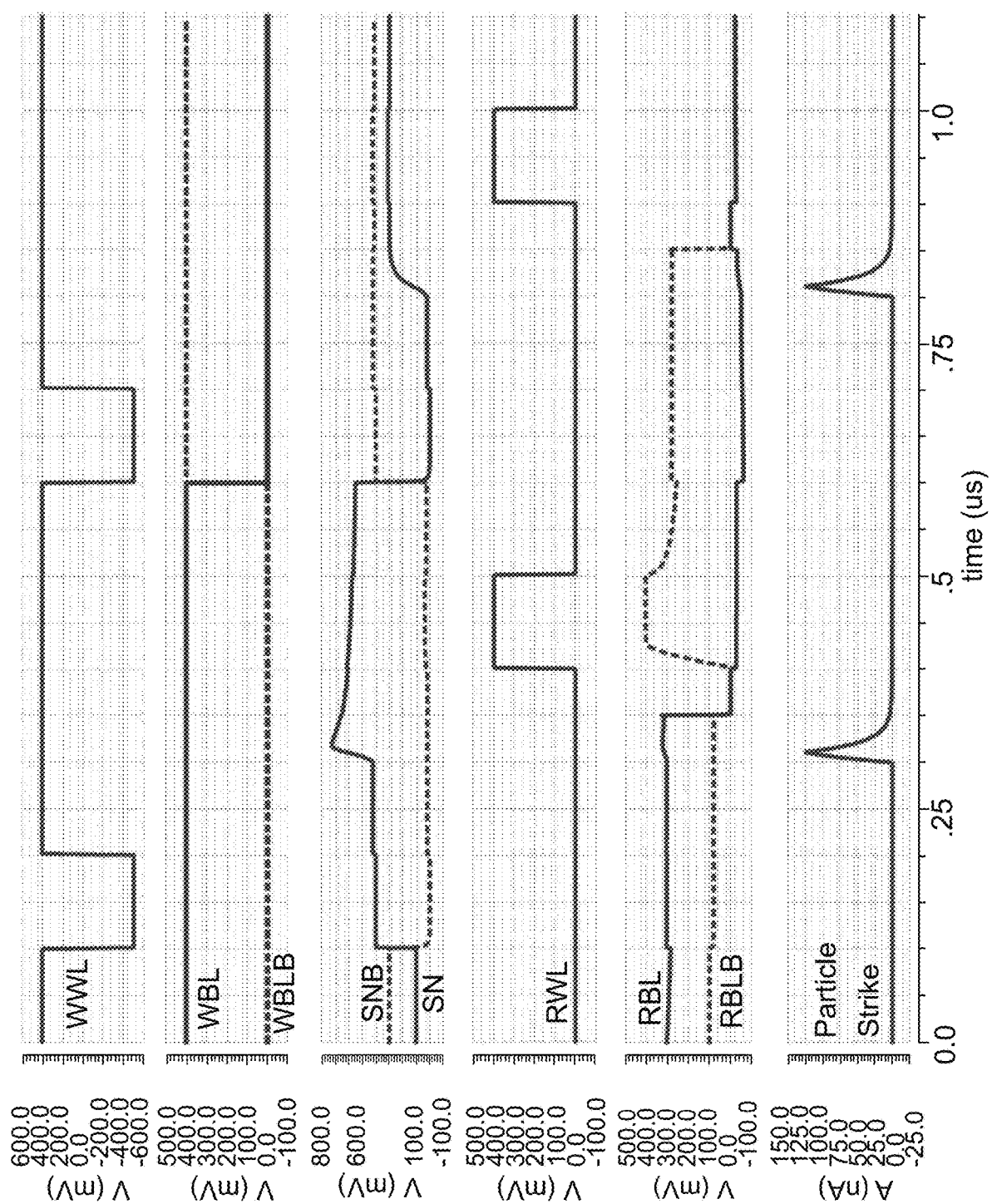
FIG. 4 is a waveform demonstration of write-upset-read events.

The operation of the 4T GC-eDRAM CDMR memory cell under SEUs is demonstrated in FIG. 4. FIG. 4 shows consecutive write, upset, and read events for data '1' and '0' with a 400 mV supply voltage. The SEU was modeled by connecting a current source to the SN node of the bitcell and applying a double-exponential current pulse during the standby states of the cell, according to the model presented in [18]. The physical composition of the cell only allows a positively charged upset [15], and therefore, in the example, only this type of particle strike is shown. In the first demonstrated strike (particle strike 1), the cell is storing a '1', and the positive charge only strengthens the stored level, leaving RBL discharged during readout and not leading to an error. On the hand, when data '0' is stored, the applied pulse (particle strike 2) causes an increase in the voltage level stored at SN, causing the RBL to erroneously charge during readout. Since the complementary value, stored in SNB, is also a data '1', both RBL and RBLB provide a logic '1' at the output, indicating that an error has occurred. In addition, the parity will no longer be correct, which implies that the error occurred in the SN of the erroneous bit, and therefore, this node should be pulled back down to '0' to correct the error.

The sensitivity of a memory bitcell to particle strikes is commonly quantified using the $C_{crit}$ metric, which is determined by integrating the applied current source at the point where it causes a read failure following an SEU. However, the inherent error detection and correction capabilities of the proposed topology and architecture significantly reduce the relevance of the $C_{crit}$ metric and make it inappropriate for comparison with other solutions. Nonetheless, the $C_{crit}$ of the 4T bitcell was extracted through simulation under particle strikes, as described in Sec. V-D below.

V. Exemplary CDMR Memory Array

Reference is now made to FIG. 5, which is a simplified block diagram of a CDMR Memory Array, according to embodiments of the invention. It is noted that the invention is not limited to a particular type of memory cell, or memory array size, architecture and/or structure. The CDMR memory array may be implemented in any size or architecture which incorporates CDMR memory cells as described herein. The analysis and results presented below are for a CDMR Memory Array comprising a 64×32 array of 4T GC-eDRAM CDMR memory cells.

Optionally, in order to enable recovery of the correct level from a flipped cell at least one parity column is integrated to the CDMR memory array. These parity cells hold the parity bit of the corresponding word. For the 4T GC-eDRAM CDMR memory cell, the correct data may be recovered from an error detected cell using simple comparison logic. In general, any number of errors may be recovered from the accessed row depending on the number of parity columns. Every parity bit enables the recovery of an additional error, compromising area overhead due to additional parity bit-cells. These parity cells are optionally 4T CDMR memory cells.

For proof of concept, the results presented below used a single parity bit in every row consisting of 32 bits, corresponding to a single error recovery per row, resulting in an area overhead of less than 3%.

A. Single-Ended and Differential Readout Schemes

One of the drawbacks of conventional GC-eDRAM arrays is their relatively slow read access time due to a single ended readout scheme.

In contrast, embodiments of the 4T CDMR memory cell produce both BL and BLB signals, corresponding to the two opposite level stored in the cell. Therefore, a differential readout scheme may be employed, resulting in a faster access time and reliability. To illustrate this, the read access time of a single ended and differential readout schemes was post-layout simulated and compared.

Figure 6A:
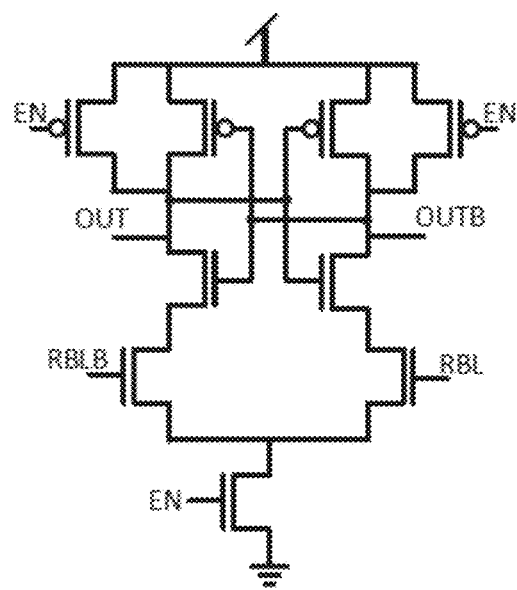
FIG. 6A is a simplified circuit diagram of a CDMR memory cell with differential sense amplifier, according to exemplary embodiments of the invention.
Figure 6B:
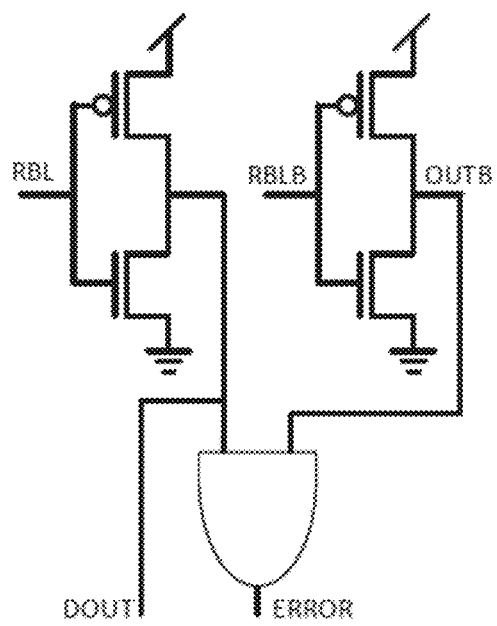
FIG. 6B is a simplified circuit diagram of a CDMR memory cell with single-ended readout with error detection, according to exemplary embodiments of the invention.

For the comparisons presented below, a conventional latching sense amplifier was used for the differential readout mode, while a simple inverter was used for the single-ended readout mode. Only minimal sized regular $V_T$ transistors were used. The differential sense amplifier circuit and single-ended readout with error detection circuits are shown in FIGS. 6A and 6B respectively.

Figure 6C:
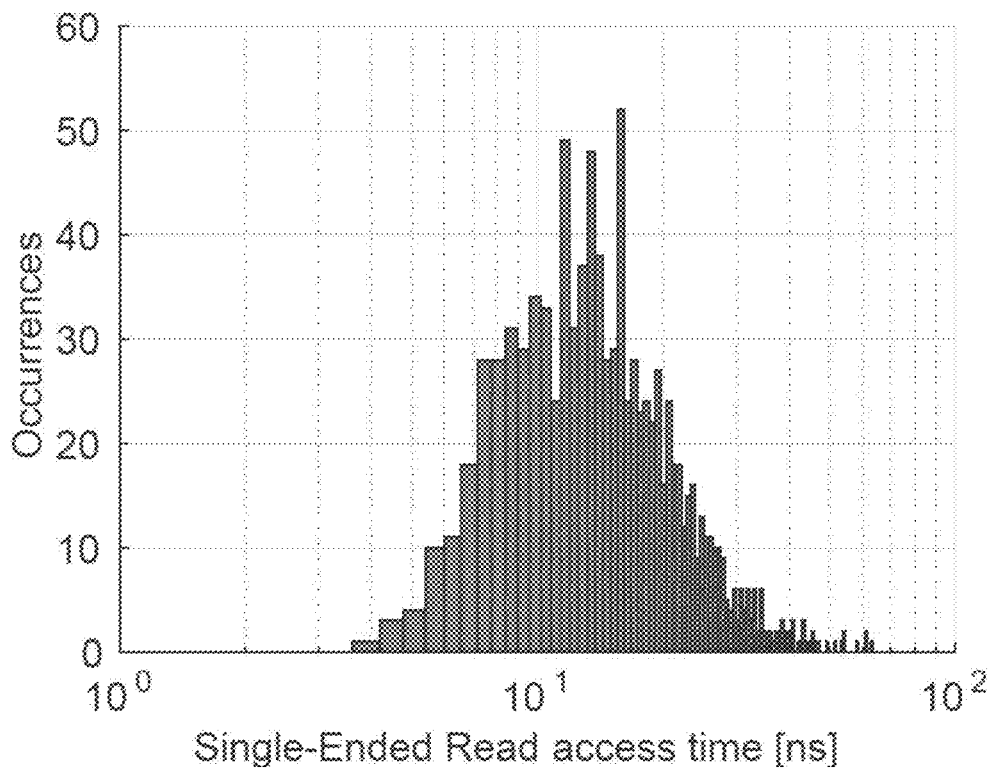
FIG. 6C is a histogram showing read access time distribution for single-ended readout.
Figure 6D:
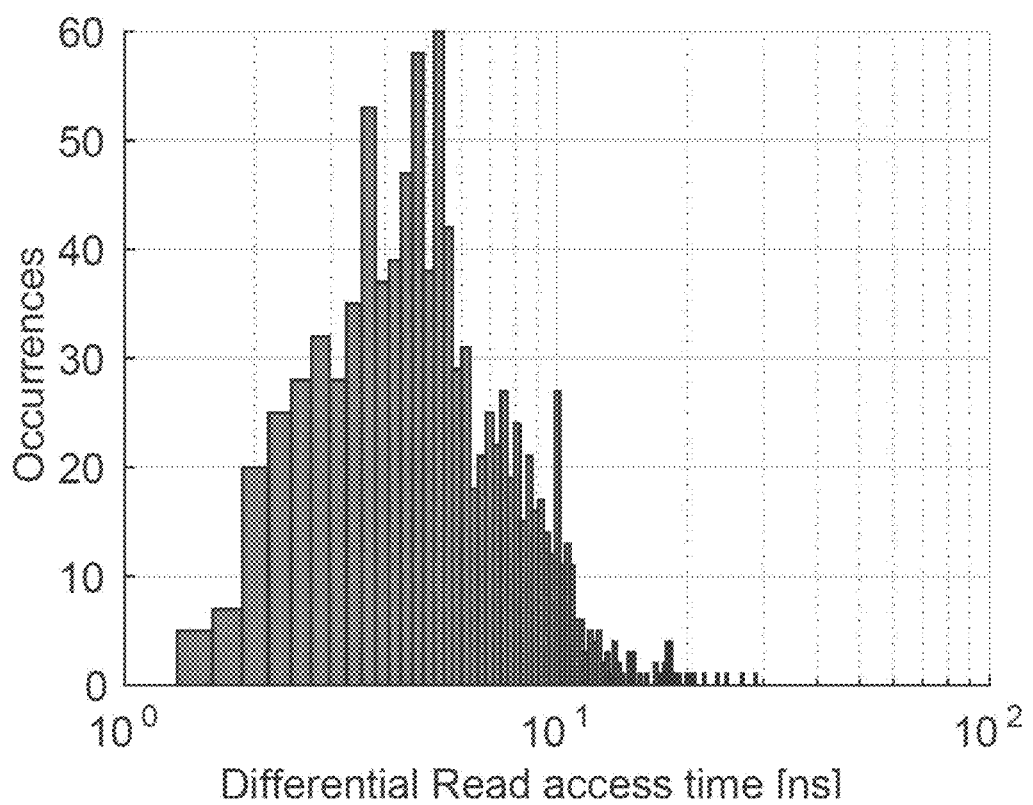
FIG. 6D is a histogram showing read access time distribution for differential readout.

FIGS. 6C and 6D are histograms showing the read access times of single-ended readout mode and differential readout mode respectively. The read access times were extracted from 1K Monte-Carlo simulations modeling both global and local variations (mismatch) under a 700 mV supply voltage. As seen in FIGS. 6C-6D the differential sense amplifier has a faster access time. Both readout schemes may also be used independently without affecting the RBL level, due to the high input impedance of both sense circuits. While the differential readout provides better performance, the two single ended sense inverters may be used to produce delayed results, indicating whether an error has occurred.

VI. Comparison Results

In order to demonstrate the advantages of the 4T GC-eDRAM CDMR memory cell over conventional 6T SRAM and other error tolerant solutions, section VI presents CDMR memory cell layout and error tolerance comparisons.

A. Layout Comparison

One of the most important factors in memory design is a small bitcell area, in order to be able to integrate as much memory as possible with a small area cost. As a result, conventional SRAM memories are usually implemented in dense design rules, trading off stability and soft error tolerance. Therefore, one of the main goals in the design bitcells is to maintain a small area penalty, while still maintaining a soft error tolerance.

The layout of a 65 nm 4T CDMR memory cell, implemented with standard-VT PMOS transistors, comprises an area of 1.01 µm². The CDMR memory cell is 47% smaller than the standard non-SEU tolerant memory circuit, and between 2.5×-5× smaller than the other considered bitcells (see Table 1 below).

In an exemplary embodiment of the 4T GC-eDRAM CDMR memory array, the parity bits are stored in 4T GC-eDRAM CDMR memory cells and therefore they consume less than 3% of the total array size. Use of a single parity cell enables the error correction of one bit per row. Additional parity cells may enhance the error correction capabilities, therefore presenting a trade off with the resulting array size as described below. The extra periphery needed for error correction is implemented using an additional AND gate per every two columns and standard error correction circuitry, used in conventional ECCs.

B. Error Detection and Correction

State-of-the-art circuit level solutions, such as DICE, Quatro 10T and SHIELD, are mainly targeted at high-radiation environments such as space, where memories are likely to encounter SEUs caused by alpha particle strikes. While these memories are more immune to SEUs, they do not detect any number of errors in case an SEU has occurred. Moreover, errors caused by process, voltage, or temperature (PVT) variations cannot be detected or corrected. In order to be able to detect errors, ECC must be integrated into the memory array as well, requiring even more area and complexity to the already modified memory. Nonetheless, ECCs can only detect a limited number of errors based on the used ECC scheme, as described in section II-B.

In contrast, the CDMR memory array presented herein may detect all the errors of an accessed row, independent of the number of bits per row and without the need for extra hardware. This may be done using the dual single-ended readout structure, indicating an error has occurred if both outputs are '1', as described in section III-D. The error correction capability depends on the amount of extra bitcells holding the parity bits of the row. For example, the addition of two parity cells provides a capability of correcting up to two errors per row, similar to single error correction-double error detection (SECDED) and at a much smaller area overhead.

V. Simulation Results

A. Data Retention Time Analysis

The data retention time (DRT) of GC-eDRAMs is a dominant factor in the memory design, affecting both the power consumption and the availability of the memory array. It is primarily limited by the level set by the initial charge stored in the bitcell and the leakage currents that degrade this level. After write, the stored data starts deteriorating due to leakage currents from the storage node, and therefore it requires periodic refresh cycles. Depending on the type of write transistor (WT), one of the data levels has a much higher retention time than the other ('1' for a PMOS WT, '0' for a NMOS WT). However, when determining the refresh frequency, one must consider the deterioration of the weaker data level under worst-case conditions, i.e. when the write bitline (WBL) is driven to the opposite level of the stored data during retention periods.

Figure 7:
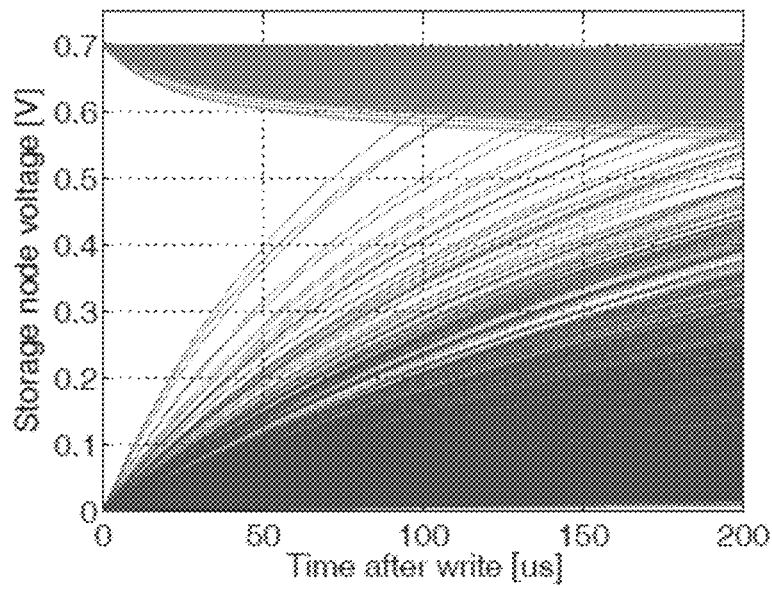
FIG. 7 is a graph showing storage node degradation of a simulated 4T CDMR memory cell following a write operation under worst case WBL bias conditions.
Figure 8:
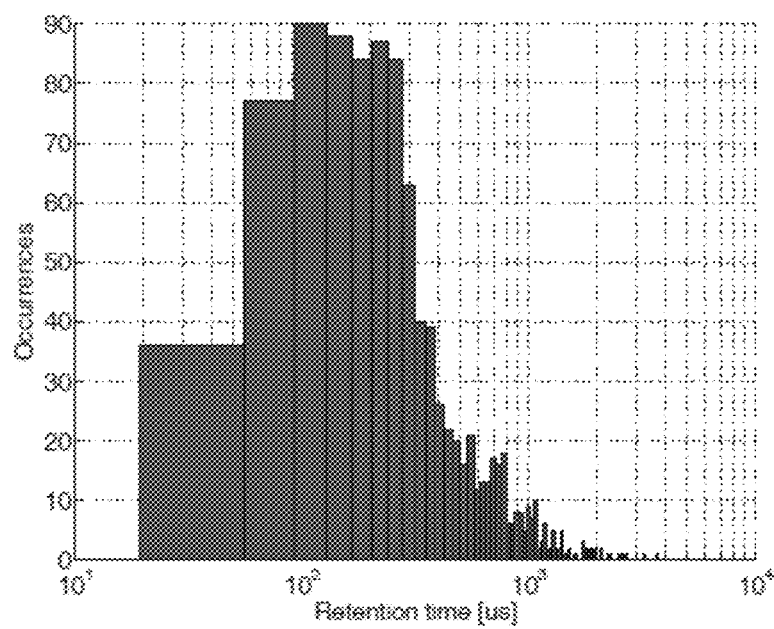
FIG. 8 is a histogram showing DRT distribution of a simulated 4T CDMR memory cell.

The exemplary 4T all-PMOS CDMR memory cell presented herein, displays asymmetric retention characteristics with highly advantageous retention of data '1' over data '0'. This is illustrated in FIG. 7, which shows the storage node degradation following a write operation under worst case WBL bias condition. The plot was extracted from 1K Monte-Carlo simulations modeling both process variations and mismatch. The result of the above phenomenon indicate that a read failure can only occur due to a deteriorated '0' level in the cell. The DRT of the 4T cell was determined as the time after write when the voltage difference between the degraded '1' and '0' levels deteriorates to 200 mV. The resulting DRT distribution is given in FIG. 8, with a worst case DRT of 50 us.

B. Static Power Consumption

The static power of memory arrays is often considered the most important aspect of chip power consumption, due to the large number of bitcells in a standby state at any given time. Whereas leakage is the dominant static power component of a standard SRAM, when considering a dynamic memory such as the CDMR memory cell, the static power comprises both the leakage and the refresh power of the array, and in most cases, the refresh power is the dominant factor. Since the refresh power is a function of the data retention time (DRT), extraction of the DRT is essential for static power estimation.

The standby power of a GC-eDRAM comprises the leakage power of the array and the dynamic refresh energy, consumed during every refresh period. This total standby power is often referred to as the retention power of the array. For correct power analysis, the refresh period for the simulation was chosen to be 50 µs, and the reciprocal of this value was used as the refresh rate in calculation of the refresh power.

Figure 9:
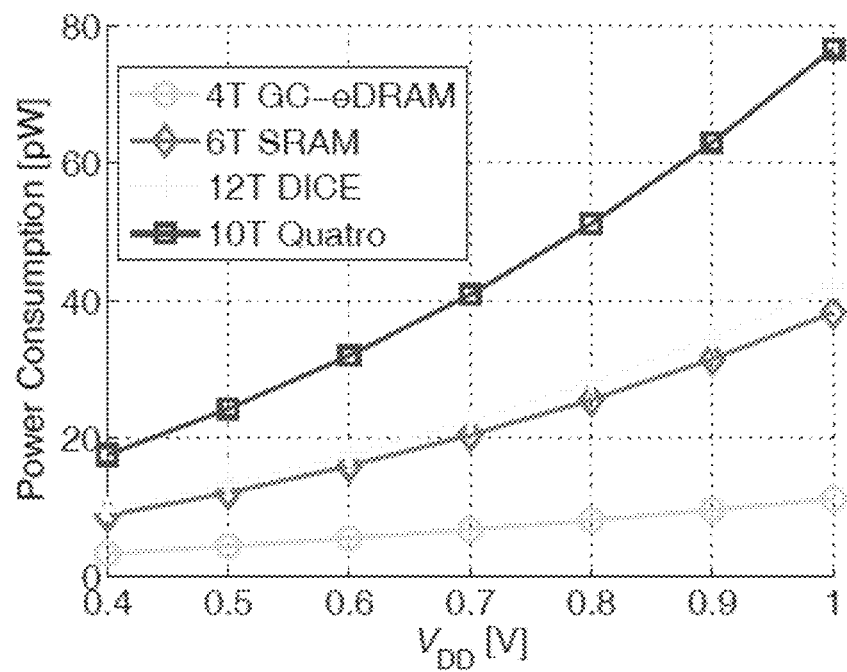
FIG. 9 is a graph comparing the retention power of a simulated 4T CDMR memory cell and prior art solutions.

FIG. 9 compares the retention power of the exemplary 4T GC-eDRAM CDMR memory cell with the static power consumption of a conventional 6T SRAM cell and other circuit level SEU hardened bitcells. The refresh power constituted 40% to 60% of the total power consumption of the 4T GC-eDRAM CDMR memory cell, depending on the supply voltage. Simulations were made under worst-case biasing during retention with WBL and WBLB kept at the opposite voltage levels to those stored at SN and SNB, resulting in the highest leakage currents. Nevertheless, the 4T GC-eDRAM CDMR memory cell clearly has the lowest standby power consumption across the entire range of simulated supply voltages. This is a reduction of 59%-87% at nominal conditions (1.2 V) and 48% lower than the SHIELD solution at 0.4V, which is the only other functional solution at such a scaled operating voltage.

C. Refresh Power Reduction Using Error Correcting Scheme

The error correcting nature of embodiments of the GC-eDRAM CDMR memory cell array relies on the fact that only data '0' is subject to errors. This is due to several factors. Since a particle strike may only cause a positive voltage shift on the storage nodes of the cell, SEU can only affect data '0', causing a readout failure. Furthermore, as discussed in section VI-A, data '0' is the weaker level in terms of retention time characteristics, making it susceptible to errors due to data deterioration resulting from leakage currents. As a result, the power consuming refresh cycles rate is set by the DRT of data '0'.

Figure 10A:
FIG. 10A is a graph of the refresh rate of a simulated 4T CDMR memory cell.
Figure 10B:
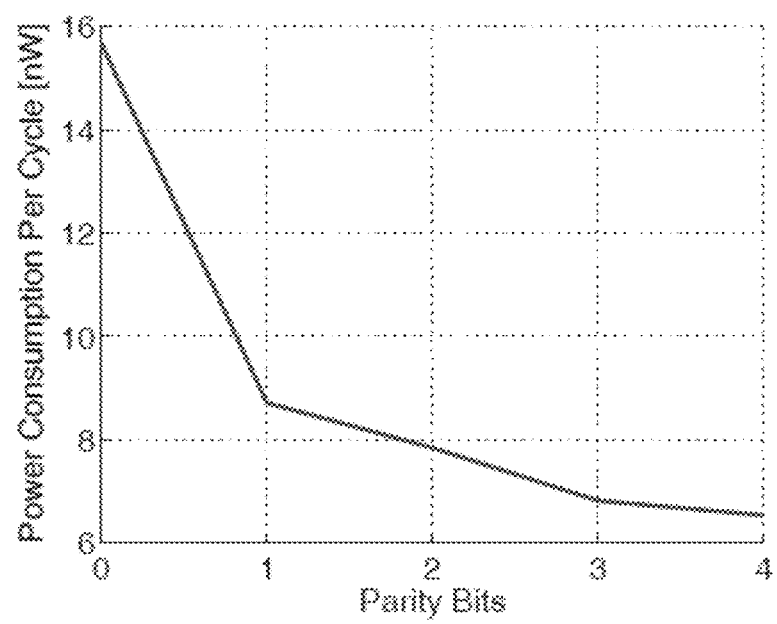
FIG. 10B is a graph of the refresh power consumption of a simulated 4T CDMR memory cell.

This phenomenon indicates that using the error correcting scheme of the memory array and lowering the refresh rate, allowing a number of possible errors which may be corrected, may result in substantial power savings. As previously discussed, the number of allowable errors is set by the number of parity bits per row, corresponding to the error correcting capability of the memory array. FIG. 10A shows the refresh rate as a function of the parity bits per row, indicating that a single parity bit may reduce the refresh rate by almost two times, while extending the number of parity bits to 4 results in a 2.5 times reduction in the refresh rate. This results in substantial power reduction, illustrated in FIG. 10B, where the power consumption per cycle for a 2 Kb array is reduced by almost 3 times using 4 parity bits.

D. Critical Charge

The critical charge is a commonly used design metric in determining the tolerance level of a cell to SEU, occurring due to a particle strike at a cell's internal node. While the CDMR memory array error detecting and correcting schemes enable the recovery of an error due to a SEU, for fair comparison to other bitcell solutions, this section will analyze the 4T GC-eDRAM CDMR memory cell critical charge and compare it to other SEU hardened bitcells. In order to mimic the event of a particle strike, SEUs are modeled by injecting the current pulse at the sensitive nodes. The current pulse has fast rise time and gradual fall time. The shape of the current pulse is approximated by:

$$I(t) = \frac{Q_{coll}}{t_f - t_r}\left(e^{-\frac{t}{t_f}} - e^{-\frac{t}{t_r}}\right), \quad (1)$$

where Q is the charge collected due to particle strike, $t_r$ is the rise time and $t_f$ is the fall time. The sensitivity of a device described by the minimum charge needed to upset the function. This minimum charge is called the critical charge ($Q_{crit}$). The simplest approach is to consider the critical charge as the product of the total capacity $C_i$ at a given node by the power supply voltage $V_{DD}$, therefore, $Q_{crit}=C_i \times V_{DD}$. This approach is very useful to obtain a rough estimation of the critical charge. A more precise approach to obtain the critical charge is to use a circuit simulator and to describe the collected charge by a double exponential current generator of short duration applied at the sensitive node. The total charge deposited by a particle strike may be calculated by numerically integrating the transient current pulse, and $Q_{crit}$ is defined as the minimum charge deposited in a sensitive node that results in a memory bit-flip.

Figure 11:
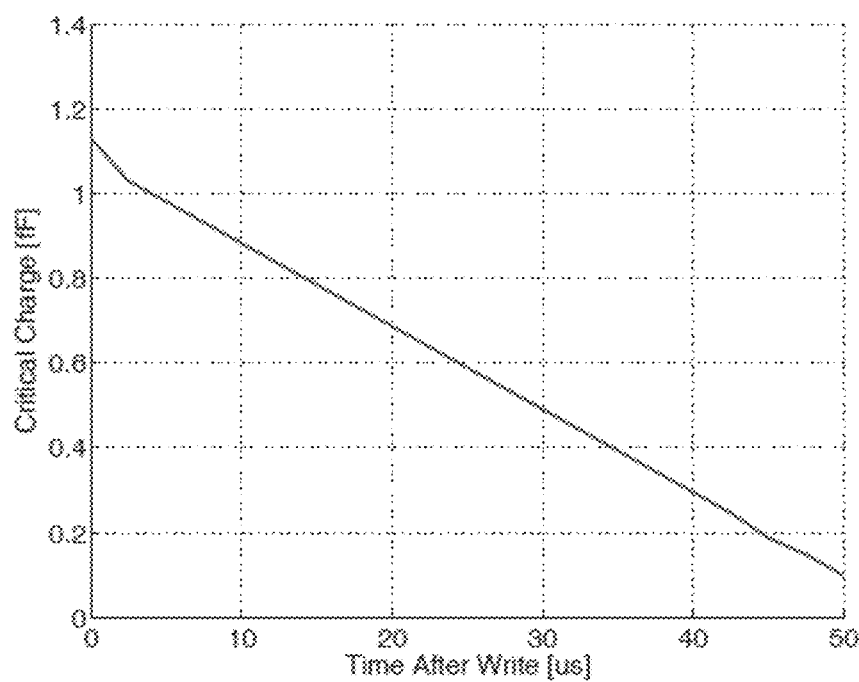
FIG. 11 is a graph of critical charge as a function of the time after write.

In the case of the 4T GC-eDRAM bitcell, a bit flip may only be determined at the point where a read operation fails, similarly to the calculation of the retention time of the cell. Moreover, the critical charge varies with time due to the deterioration of the stored voltage in the cell, specifically for data '0', which is susceptible to SEU. Simulation of a particle strike with the SEU model of (1) is the most popular technique for evaluation of the rad-hardening ability of a memory bitcell. For the 4T GC-eDRAM CDMR memory cell, the critical charge was simulated in this method at different times after a write operation, and determined at the point where a readout failure was detected following the injected current pulse. The results are shown in FIG. 11 for a under GC-eDRAM CDMR memory cell worst-case retention time conditions. As expected, the critical charge has the highest value following a write '0' operation and it degrades as time passes due to a deteriorated '0' level as a result of leakage. After 50 us the critical charge is equal to 0 since the retention time has passed and any particle strike may cause a readout error. While these values are significantly smaller than those presented by other circuit level solutions, the error-correction and detection capabilities of the cell make them sufficient for high-radiation operation.

Table 1 summarizes the comparison between the 4T CDMR memory and other considered solutions. The table clearly emphasizes the benefits of the proposed solution, achieving much lower static power and area consumption compared to other memory options and including inherent error detection capability and a low overhead error correction capability.

TABLE 1

Comparison of Memory Solutions for Space Applications

| Memory type | 6T SRAM | 12T DICE | Quatro 10T | SHIELD | 4T CDMR memory |
|---|---|---|---|---|---|
| Cell size | 451 $f^2$ | 861 $f^2$ | 1159 $f^2$ | 947 $f^2$ | 240 $f^2$ |
| Cell static power @ 1.2 V | 54.9 pW | 58.3 pW | 110.6 pW | 35.7 pW | 14.7 pW |
| Protection mechanism | — | Increased $C_{crit}$ | Increased $C_{crit}$ | Increased $C_{crit}$ | CDMR |
| Error detection | | requires parity or ECC for each detection | | | inherent per-bit detection |
| Error correction | | requires ECC (e.g., 7 bits for 1 error in 32-bit word) | | | 1-bit parity per error |

In summary, some embodiments of the invention described herein provide error tolerant CDMR memory cells and CDMR memory arrays, optionally based on GC-eDRAM transistors. Both circuit and architectural techniques may be used to provide a soft error tolerant memory. Embodiments of a CDMR memory array formed from CDMR memory cells are fully compatible with low voltage operation, consume less area than any other soft-error tolerant solution and are capable of detecting any number of errors during a readout operation. Furthermore, multi-bit error correction may be done with only a modest increase in the area overhead. In addition, the CDMR memory array is compatible with differential readout schemes, resulting in a better performance and reliability than conventional GC eDRAM arrays.

It is expected that during the life of a patent maturing from this application many relevant transistors, types of transistors, bitcells, memory arrays, memory array architectures, error detection techniques and error correction techniques will be developed and the scope of the terms transistor, transistor type, bitcell, memory array, memory array architecture, error detection and error correction are intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A memory cell, comprising:
a data write input, configured to input data levels for storing in said memory cell;
a data read output;
an indicator output;
a first bitcell connected to said data write input and said data read output, configured to store a first data level input from said data write input and to output a first read data level to said data read output; and
a second bitcell connected to said data write input, configured to store a second data level input from said data write input to output a second read data level; and
a comparator associated with said first bitcell, said second bitcell and said indicator output, configured to compare a data level read from said first bitcell and a data level read from said second bitcell and to provide, at said indicator output, an indicator when said first read data level and said second read data level are non-complementary,
wherein said first bitcell comprises a write transistor and a read transistor, and wherein: a first diffusion connection of said write transistor is connected to said data write input, a gate connection of said write transistor is connected to a write trigger input, a first diffusion connection of said write transistor is connected to a first comparator input, a second diffusion connection of said write transistor is connected to a write trigger input, and a second diffusion connection of said write transistor is connected to a gate connection of said read transistor to form a first storage node; and
said second bitcell comprises a write transistor and a read transistor, and wherein: a first diffusion connection of said write transistor is connected to said data write input, a gate connection of said write transistor is connected to said write trigger input, a first diffusion connection of said write transistor is connected to a second comparator input, a second diffusion connection of said write transistor connected to said write trigger input, and a second diffusion connection of said write transistor is connected to a gate connection of said read transistor to form a second storage node.

2. A memory cell according to claim 1, wherein said first and second data levels are input at said data write input in parallel.

3. A memory cell according to claim 1, further comprising at least one processor adapted to execute code instructions to provide said first data level to said first bitcell and a complementary data level to said second bitcell.

4. A memory cell according to claim 1, further comprising an inverter connected to said data write input, configured to invert said first data level and to provide said inverted data level as said second data level to said second bitcell.

5. A memory cell according to claim 1, further comprising at least one processor adapted to execute code instructions to determine, in accordance with said indicator, a correct data level from at least one of said read data levels.

6. A memory cell according to claim 5, further comprising a parity bit, and said code instructions for determining a correct data level use said parity bit for said correcting.

7. A memory cell according to claim 1, wherein said memory cell is a static memory.

8. A memory cell according to claim 1, wherein said memory cell is a dynamic memory.

9. A memory cell according to claim 1, wherein write operations for said first and second bitcells are triggered from a write trigger input and read operations for said first and second bitcells are triggered from a read trigger input.

10. A memory cell according to claim 1, wherein said first bitcell and said second bitcell comprise respective write transistors triggered from a write trigger input and respective read transistors triggered from a read trigger input.

11. A memory cell according to claim 10, wherein write transistors of said first and second bitcells are a same transistor type.

12. A memory cell according to claim 10, wherein read transistors of said first and second bitcells are a same transistor type.

13. A memory cell according to claim 10, wherein all transistors of said first and second bitcells are a same transistor type.

14. A memory cell according to claim 10, wherein all transistors of said first and second bitcells are gain cell embedded DRAM (GC-eDRAM) transistors.

15. A memory cell according to claim 1, wherein said first bitcell comprises a read bit line output configured to output said first read data level read from said first bitcell.

16. A memory cell according to claim 1, wherein all of said first bitcell transistors and said second bitcell transistors are gain cell embedded GC-eDRAM transistors.

17. A memory array comprising:
   a data write input port, configured to input data levels for storing in said array;
   a data read output port, configured to output data levels from said memory array;
   an indicator output port;
   a plurality of memory cells, each of said memory cells comprising:
      a first bitcell connected to said data write input port and said data read output port, configured to store first data levels and to output first read data levels; and
      a second bitcell connected to said data write input port, configured to store second data levels and to output a second read data levels;
   at least one comparator, configured to compare respective first and second read data levels a selected memory cell and to provide, at said indicator output port, a respective indicator when said first read data level and said second read data level are non-complementary; and
   at least one non-transitory computer readable storage medium storing instructions and at least one processor configured to execute said instructions to correct memory cell errors by applying error correction logic to at least one data level read from a respective one of said memory cells and a respective indicator.

18. A memory array according to claim 17, wherein said processor is further configured to execute said instructions to provide, at said write input port, first data levels for storing in said first bitcells and complementary data levels for storing in respective second bitcells.

19. A memory array according to claim 18, further comprising a parity array comprising at least one parity bit per column of said memory cells, wherein said error correction logic uses said parity array for said correcting said memory cell read errors.

20. A memory array according to claim 18, wherein said memory array is a static memory array.

21. A memory array according to claim 18, wherein said memory array is a dynamic memory array.

22. A memory array according to claim 18, wherein said first bitcells and said second bitcells are stored in different rows of said memory array.

23. A memory array according to claim 18, wherein said first bitcells and said second bitcells are stored in different portions of said memory array.

24. A method comprising:
   providing a memory cell comprising:
      a first bitcell configured to store a first input data level and to output said stored first data level to a data read output; and
      a second bitcell configured to store a second input data level;
   storing a first data level in said first bitcell and a complementary data level in said second bitcell;
   reading first and second data levels from said first and second bitcells respectively;
   providing an indicator when first and second read data levels are non-complementary;
   performing error correction on said first and second read data levels to correct said first data level when said indicator is provided; and
   outputting said first data level.

* * * * *

UNITED STATES PATENT AND TRADEMARK OFFICE
CERTIFICATE OF CORRECTION

PATENT NO. : 10,991,421 B2
APPLICATION NO. : 16/317837
DATED : April 27, 2021
INVENTOR(S) : Robert Giterman et al.

Page 1 of 1

It is certified that error appears in the above-identified patent and that said Letters Patent is hereby corrected as shown below:

On the Title Page

Item (71) Applicant,
"Bar-llan University" should be changed to --Bar-Ilan University--

Signed and Sealed this
Seventh Day of September, 2021

Drew Hirshfeld
*Performing the Functions and Duties of the
Under Secretary of Commerce for Intellectual Property and
Director of the United States Patent and Trademark Office*